(12) United States Patent
Hsu et al.

(10) Patent No.: US 8,866,508 B2
(45) Date of Patent: Oct. 21, 2014

(54) SYSTEM AND METHOD FOR CALIBRATING CHIPS IN A 3D CHIP STACK ARCHITECTURE

(75) Inventors: Ying-Yu Hsu, Hsinchu (TW); Ruey-Bin Sheen, Taichung (TW); Chih-Hsien Chang, New Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 260 days.

(21) Appl. No.: 13/355,024

(22) Filed: Jan. 20, 2012

(65) Prior Publication Data

US 2013/0187677 A1 Jul. 25, 2013

(51) Int. Cl.
| | |
|---|---|
| *G01R 31/02* | (2006.01) |
| *G01R 31/30* | (2006.01) |
| *G01R 31/26* | (2014.01) |
| *G01R 31/319* | (2006.01) |
| *G01R 31/3193* | (2006.01) |

(52) U.S. Cl.
CPC ............ *G01R 31/3004* (2013.01); *G01R 31/26* (2013.01); *G01R 31/2607* (2013.01); *G01R 31/3191* (2013.01); *G01R 31/3193* (2013.01); *G01R 31/31924* (2013.01)
USPC ............ 324/762.02; 324/762.03; 324/762.06; 324/750.02; 375/224; 375/229; 375/295; 333/18; 333/20

(58) Field of Classification Search
CPC .................. G01R 31/31924; G01R 31/31922; G01R 31/2886; G01R 31/3008; G01R 31/2884; G01R 31/318513; G01R 31/31937; G01R 31/3004; G01R 35/00; G01R 35/005; G01R 31/3191; G01R 1/06705; G01R 27/28; G01R 27/32; G01R 1/28; G01R 15/202; G01R 31/318505; G01R 31/31905; G01R 31/31926; G01R 31/043; G06F 13/4072; G11C 5/147; G11C 29/02; G11C 29/021; G11C 29/1201; H04L 25/0264; H04L 25/08; H04L 25/028; H04L 25/0282; H04L 25/03878; H03F 3/45479; H04B 3/48; H05K 999/99
USPC ............ 324/750.01–750.02, 750.3, 601, 130, 324/762.02, 762.06; 375/295, 316, 229, 375/224, 286; 333/18, 20, 28; 455/23, 73; 330/86
See application file for complete search history.

(56) References Cited

U.S. PATENT DOCUMENTS

| | | | |
|---|---|---|---|
| 6,995,627 B2 * | 2/2006 | Casper et al. .................. 333/18 |
| 7,155,352 B2 * | 12/2006 | Schoenborn .................... 702/64 |
| 7,408,995 B2 * | 8/2008 | Segaram ........................ 375/257 |
| 8,279,948 B2 * | 10/2012 | Frans et al. .................... 375/257 |
| 2004/0184409 A1 * | 9/2004 | Schoenborn et al. ......... 370/249 |
| 2004/0202254 A1 * | 10/2004 | Segaram ........................ 375/257 |
| 2007/0073506 A1 * | 3/2007 | Boskovic ....................... 702/107 |
| 2011/0319014 A1 * | 12/2011 | Canegallo et al. ........... 455/41.1 |
| 2012/0147979 A1 * | 6/2012 | Best et al. ...................... 375/259 |
| 2012/0216084 A1 * | 8/2012 | Chun et al. .................... 714/708 |
| 2013/0038380 A1 * | 2/2013 | Cordero et al. ............... 327/524 |

* cited by examiner

*Primary Examiner* — Tung X Nguyen
*Assistant Examiner* — Thang Le
(74) *Attorney, Agent, or Firm* — Duane Morris LLP

(57) ABSTRACT

A system and method is disclosed for adaptively adjusting a driving strength of a signal between a first and second chip in a 3D architecture/stack. This may be used to adaptively calibrate a chip in a 3D architecture/stack. The system may include a transmission circuit on one chip and a receiver circuit on another chip. Alternatively, the system may include a transmission and receiver circuit on just one chip.

9 Claims, 7 Drawing Sheets

SYSTEM AND METHOD FOR CALIBRATING CHIPS IN A 3D CHIP STACK ARCHITECTURE

BACKGROUND

Chip architecture is moving beyond the traditional uniplanar arrangement of chips, i.e., where chips are positioned in a single plane. Three-dimensional ("3D") architectures are becoming more common and offer many advantages over uniplanar architectures. 3D architectures or 3D chip stacks, as used herein, encompass architectures where chips are positioned on more than one plane and may be integrated both horizontally and vertically into a single circuit. Additionally, 3D architectures also encompass the situation where there exists more than one vertical stack of chips in the circuit. 3D architectures present a variety of challenges for calibrating the chips in the circuit. Connections between chips in a 3D architecture typically involve routing connections through a silicon interposer and at least one Through Silicon Via ("TSV"). Additionally, the chips in a 3D architecture may be of different varieties, such as, but not limited to, processors, memory (of various types and capacities), digital signal processors ("DSP"), radio frequency ("RF") modules, etc., as would be familiar to those of skill in the art.

One of the challenges of a 3D architecture is that certain chips may be more difficult to connect to for standard calibration or testing. Furthermore, the different varieties of chips may cause an unbalanced load between any two given chip sets in the 3D architecture. Thus, an optimal driving strength between a first set of two given chips may not be the same as the optimal driving strength between a second set of chips due to the difference in chip-to-chip loading. Additionally, there may be a range of operating speeds which need to be accounted for.

Traditional calibration methods for uniplanar architectures use a direct current ("DC") method along with optimization methodologies such as board routing to minimize load unbalances to meet specified maximum operating speeds. This results in a fixed driving strength for all chips for all operating regimes. However, in a 3D architecture, for example, routing and loading are dependent upon the permutation of chips in the 3D architecture. Thus, if the traditional calibration methods are used in a 3D architecture, serious penalties may accrue such as a power penalty during times when the operating speed is less than the specified maximum as well as degraded signal integrity and/or a simultaneous switching output ("SSO") problem due to a minimal time for peak current.

DETAILED DESCRIPTION

With reference to the figures where like elements have been given like numerical designations to facilitate an understanding of the present subject matter, the various embodiments of a system and method for calibrating chips in a 3D chip stack architecture are described.

Embodiments of the present subject matter overcome the challenges associated with implementing calibration methods for 3D architectures and avoid the penalties that that must be paid when using traditional calibration methods that result in fixed driving strengths for all chip pairs in the 3D architecture at all times and operating conditions. In one embodiment, described in further detail below, the driving strength between a first and second chip in a 3D architecture is adaptively adjusted by sending a first signal from the first chip to the second chip, comparing the signal received by the second chip with a voltage input high ("VIH") signal and a voltage input low ("VIL") signal, comparing a version of each of the resultant signals with a version of a VIH duty signal and a VIL duty signal, respectively, sending the resultant compared signals back to the first chip which causes circuitry on the first chip to send a modified first signal in response to the received compared signals. In another embodiment, described in further detail below, the driving strength between a first and second chip in a 3D architecture, where the first chip may be a "near end" chip and the second chip may be a "far end" chip, is adaptively adjusted by sending a first signal from the first chip to each of four loops, two without output loads and two with output loads on the second chip. Thus, each of the loops carries a loop signal which is compared, on the first chip, with the appropriate VIH or VIL signal, as described below, and versions of the resultant signals are then compared with a version of the appropriate VIH or VIL duty signal. The resultant compared signals are then used to modify circuitry on the first chip to send a modified first signal.

Figure 1:
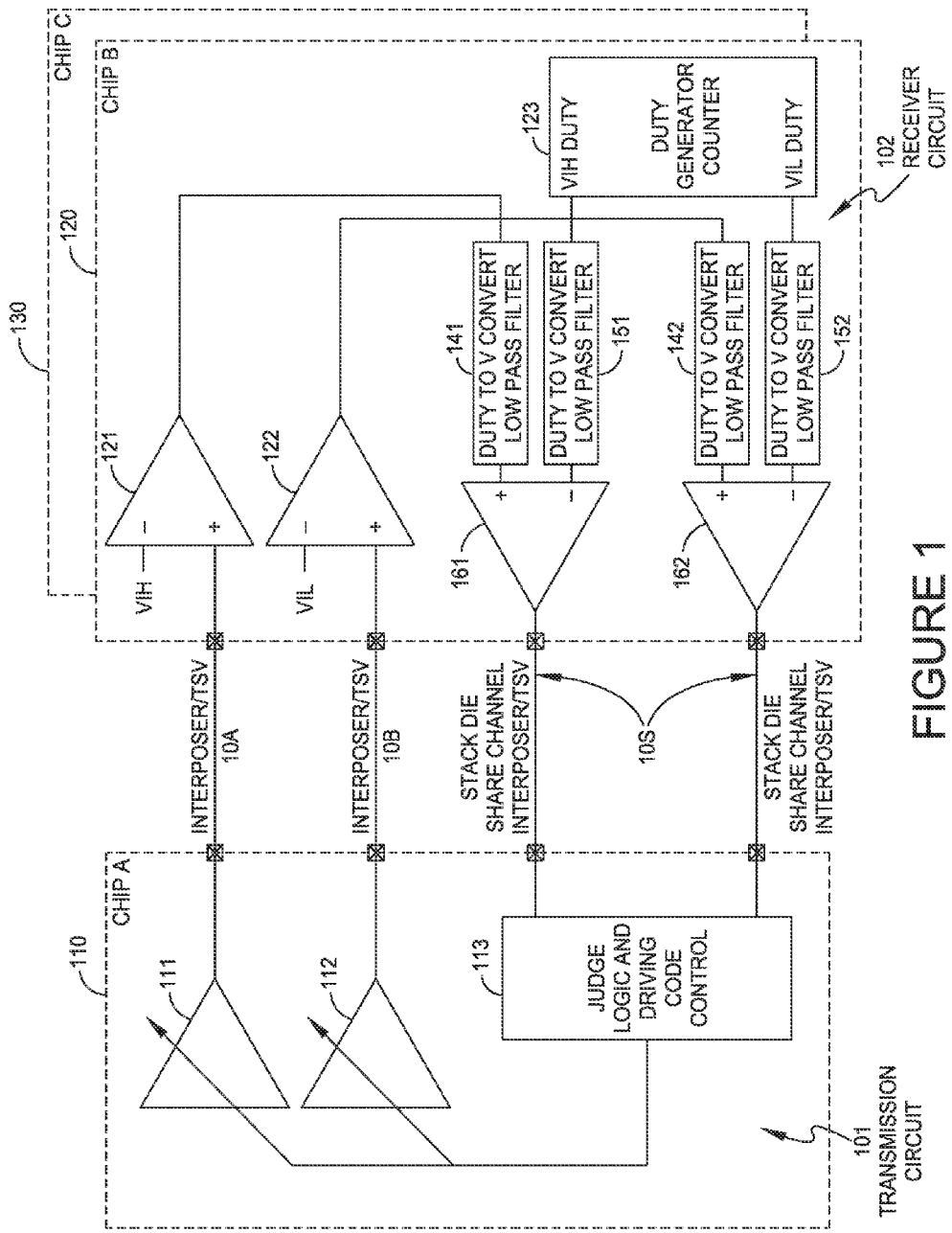
FIG. 1 is a simplified schematic diagram of a chip-to-chip calibration arrangement according to an embodiment of the present subject matter.

With attention now directed at FIG. 1, a simplified schematic diagram of a chip-to-chip calibration arrangement according to an embodiment of the present subject matter is presented. One of skill in the art will readily understand that the simplified schematic diagrams do not represent a detailed view of all circuitry and devices on a chip. Chip A, 110, Chip B, 120, and Chip C, 130, are shown where Chip A includes transmission circuit 101 and Chip B includes receiver circuit 102. Likewise, Chip C may also include a receiver circuit (not shown for sake of clarity) similar to receiver circuit 102 on Chip B. The transmission circuit on Chip A and the receiver circuit on Chip B are connected through a silicon interposer and/or one or more TSVs, shown as references 10A and 10B. In the case where Chip C also includes a receiver circuit, similar connections would be made to Chip C. Another connection, shown as reference 10S, also connects the receiver circuit on Chip B with the transmission circuit on Chip A. The same connection 10S would also connect to Chip C where Chip C included a receiver circuit. These connections, or pathways, will be discussed in further detail below. The transmission circuit 101 includes adjustable drivers 111 and 112, and logic and driving code control 113. The receiver circuit 102 includes receiver comparators 121 and 122, duty generator counter 123, duty-to-voltage converter low pass filters 141, 142, 151, and 152, and comparators 161 and 162.

In order to calibrate chips in a 3D architecture or chip stack, each driver 111 and 112 sends a signal, sometimes referred to herein as a VIH calibration signal or a VIL calibration signal, respectively, to Chip B through separate connections across the silicon interposer/TSV 10A and 10B, respectively. The VIH and VIL calibration signals are received by a respective receiver comparator 121 and 122. Receiver comparator 121 also has an input for a VIH signal, compares the VIH signal with the VIH calibration signal received from driver 111, and outputs a signal, sometimes referred to herein as a VIH comparison signal. Similarly, receiver comparator 122 also has an input for a VIL signal, compares the VIL signal with the VIL calibration signal received from driver 112, and outputs a signal, sometimes referred to herein as a VIL comparison signal. As will be discussed in further detail below with respect to FIG. 5, the VIH and VIL comparison signals operate on the transition time between a low voltage value and a high voltage value; either increasing or decreasing the transition time and thus adaptively changing the duty value based on the current operating conditions.

The VIH comparison signal is operated on by duty-to-voltage converter low pass filter 141 and the resultant output signal, which is representative of the VIH comparison signal, is input to comparator 161. Likewise, The VIL comparison signal is operated on by duty-to-voltage converter low pass filter 142 and the resultant output signal, which is representative of the VIL comparison signal, is input to comparator 162.

Duty generator counter 123 sends a VIH duty signal to duty-to-voltage converter low pass filter 151 and the resultant output signal, which is representative of the VIH duty signal, is input to the comparator 161. Duty generator counter 123 also sends a VIL duty signal to duty-to-voltage converter low pass filter 152 and the resultant output signal, which is representative of the VIL duty signal, is input to the comparator 162. The VIH and VIL duty signals are representative of the current target duty cycle of Chip B. Comparators 161 and 162 compare their respective input signals and send a VIH duty comparison signal and a VIL duty comparison signal, respectively, to the logic and driving code control 113. The VIH and VIL duty comparison signals travel from Chip B to Chip A through a shared channel, sometimes referred to herein as a feedback channel, through the silicon interposer and/or one or more TSVs 10S.

The logic and driving code control 113 receives the VIH and VIL duty comparison signals and, in response thereto, sends a signal, sometimes referred to herein as a driving signal, which modifies the state of operation of adjustable drivers 111 and 112. Consequently, the drivers 111 and 112 send a modified VIH calibration signal and a modified VIL calibration signal, respectively, to Chip B. In certain conditions, the driving signal may be such that it does not modify the drivers 111 and 112 so that the VIH and VIL calibration signals do not change. Similarly, the driving signal may only modify one of the two drivers 111 and 112.

The above-described embodiment allows for on speed operation response of the chips to the then-current real load and transition times. Furthermore, the above-described system allows for adaptive adjustment of the driving strength between Chips A and B. Since the system includes an independent receiver comparator for VIH and VIL, there is no concern for propagation delay. Also, the transition times may be adjusted independently. The duty generator counter 123 outputs the VIH and VIL duty signals that may represent the high speed performance of Chip B and the VIH and VIL duty signals are compared in comparators 161 and 162, respectively, with slower signals from the receiver comparators 121 and 122. Thus, the shared feedback channel 10S has the advantage of being able to operate at a speed lower than the design maximum while conserving valuable TSV resources in the event the number of chips in the 3D architecture increases.

Figure 2:
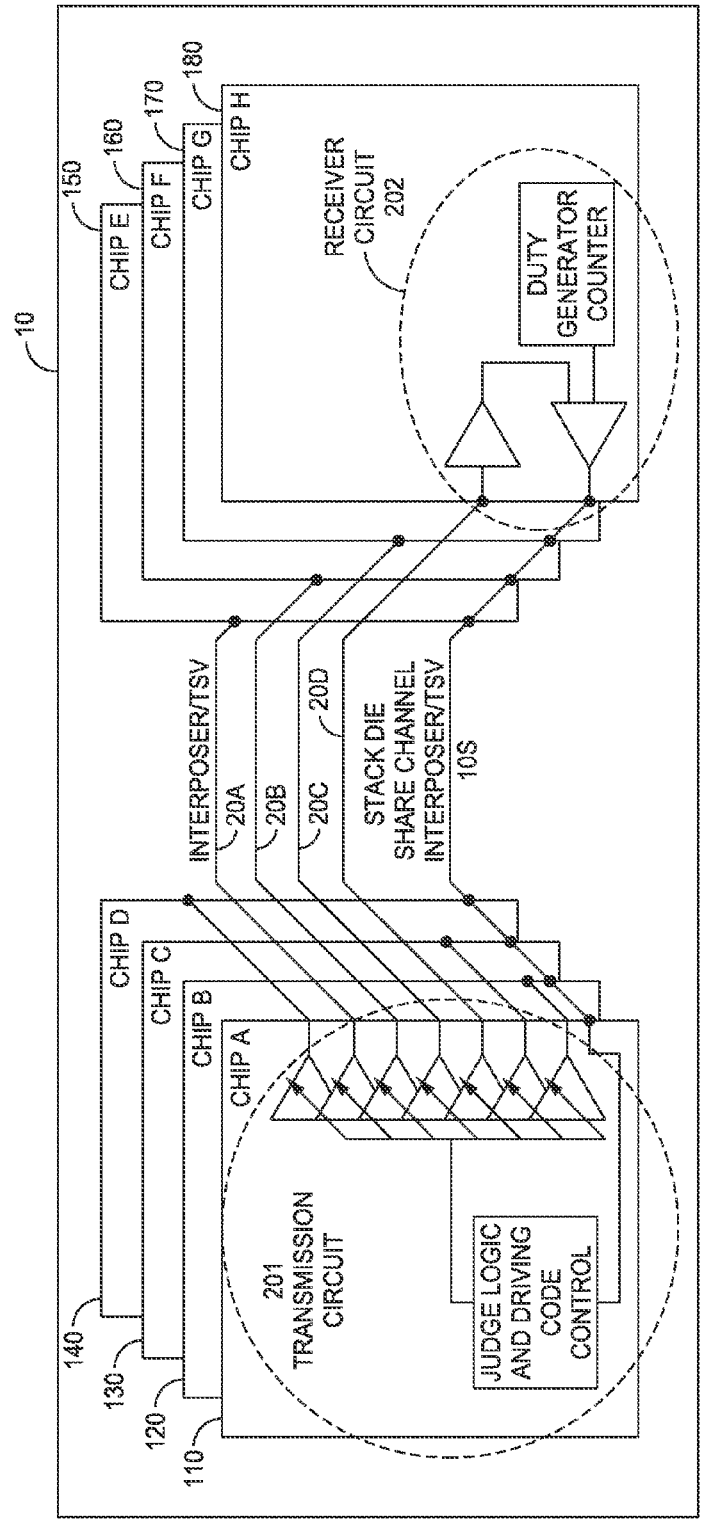
FIG. 2 is a pictorial view of a chip-to-chip calibration arrangement according to an embodiment of the present subject matter.

Directing attention now to FIG. 2, a pictorial view of a chip-to-chip calibration arrangement according to an embodiment of the present subject matter is depicted. Silicon interposer and one or more TSVs are represented by reference number 10. Also depicted are Chip A 110, Chip B 120, Chip C 130, Chip D 140, Chip E 150, Chip F 160, Chip G 170, and Chip H 180. Those of skill in the art will understand that this particular arrangement is for convenience of explanation only and in no way is the present subject matter intended to be restricted to this particular arrangement of chips. Pathways through interposer/TSV 10 between specific pairs of chips are shown as 20A, 20B, 20C, and 20D. For the sake of clarity, in FIG. 2 pathway 20A represents both pathways 10A and 10B in FIG. 1, i.e., the outputs of the transmission circuit 101 to the inputs of the receiver circuit 102. Likewise, pathways 20B, 20C, and 20D represent similar multiple connections between the respective chips. In FIG. 2, pathway 20A connects Chips A and E while pathway 20D connects Chips A and H. Also shown in FIG. 2 are connections between Chips A and B, Chips A and C, and Chips A and D, although no reference numbers are shown for the sake of clarity. These pathways also represent similar multiple connections between the respective chips. Additionally, shared feedback channel 10S, which is described above, is shown connecting each of the chips, i.e, the output of each chip's receiver circuit to the input of each chip's transmission circuit.

In FIG. 2, Chip A 110 is shown having transmission circuit 201 while Chip H 180 is shown having receiver circuit 202. Transmission circuit 201 as shown differs from transmission circuit 101 in FIG. 1 in that transmission circuit 201 includes a set of drivers for each connection to the other chips, i.e., one set of drivers for the connection to Chip B, one set of drivers for the connection to Chip C, etc. In another embodiment, transmission circuit 201 will be similar to transmission circuit 101 in FIG. 1 with the exception that the single set of outputs of the transmission circuit 201 is switched by any known switching arrangement, so that the signals sent from the output of the transmission circuit 201 are directed towards only one selected other chip in the 3D architecture. In certain embodiments, receiver circuit 202 will be similar to the receiver circuit 102 except that the receiver circuit 202 will include multiple inputs to the receiver comparators in order to establish a connection with each of the other chips in the 3D architecture. While embodiments of the present subject matter contemplate that a plurality of Chips A-H may include a transmission circuit 201 and/or a receiver circuit 202, only the transmission circuit 201 on Chip A 110 and the receiver circuit 202 on Chip H 180 are shown for clarity. Thus, in an embodiment where each chip has a transmission and receiver circuit, one of skill in the art will readily understand that chip-to-chip calibration between any pair of chips, as described above with reference to FIG. 1, can be undertaken.

Figure 3:
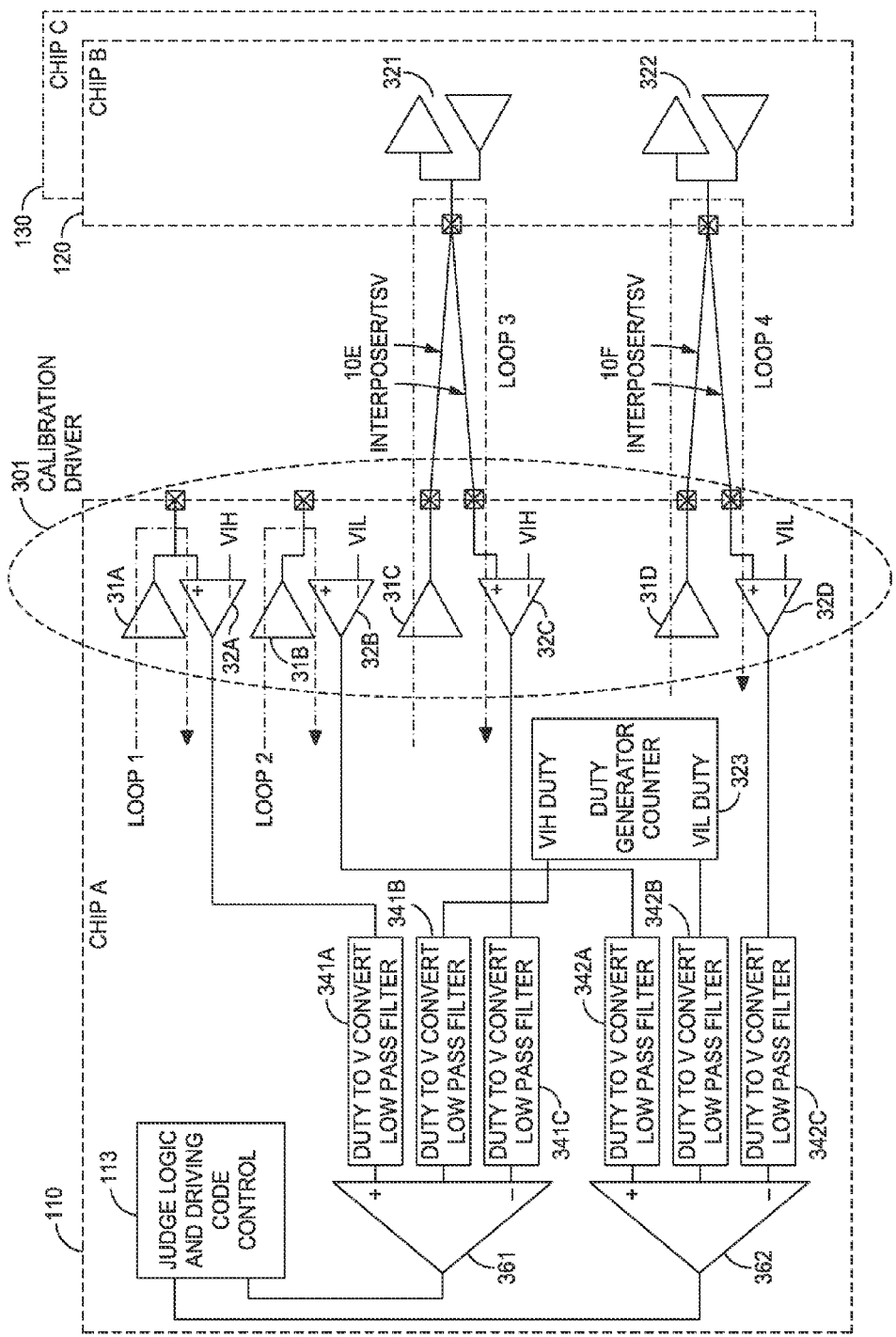
FIG. 3 is a simplified schematic diagram of a single chip calibration arrangement according to an embodiment of the present subject matter.

Looking now to FIG. 3, a simplified schematic diagram of a single chip calibration arrangement according to an embodiment of the present subject matter is shown. One of skill in the art will readily understand that the simplified schematic diagrams do not represent a detailed view of all circuitry and devices on a chip. Chip A, 110, Chip B, 120, and Chip C, 130, are shown. Chip A includes calibration driver circuitry 301, duty generator counter 323, duty-to-voltage low pass filters 341A, 341B, 341C, 342A, 342B, 342C, average comparators 361 and 362, and logic and driving code control 113. Chip B includes circuit devices 321 and 322 which represent loading on the indicated circuits/connections. Likewise, Chip C may also include a similar circuitry to Chip B, although such circuitry is not shown for sake of clarity. Chip A and Chip B are connected through a silicon interposer and/or one or more TSVs, shown as references 10E and 10F. In the case where Chip C also includes load circuitry, similar connections would be made between Chip A and Chip C.

The calibration driver circuitry on Chip A includes circuit devices 31A, 31B, 31C, and 31D, each of which receives a signal from an driver in a transmission circuit, for example transmission circuit 101 shown in FIG. 1, such as adjustable driver 111 (for circuit devices 31A and 31C) and adjustable driver 112 (for circuit devices 31B and 31D). Chip A further includes comparators 32A, 32B, 32C, and 32D. Comparators 32A and 32C each include a connection to a VIH signal while comparators 32B and 32D each include a connection to a VIL signal.

Chip A also includes duty generator counter 323, which provides a VIH duty signal and a VIL duty signal, in a manner similar to duty generator 123 described above with respect to FIG. 1. Also included on Chip A are duty-to-voltage low pass filters 341A, 341B, 341C, and 342A, 342B, 342C, which operate in a manner similar to duty-to-low pass filters 141, 142, 151, and 152 described above with respect to FIG. 1. In a particular embodiment, the inputs to these low pass filters are paired with the outputs of the comparators 32A, 32B, 32C, and 32D and the outputs of the duty generator counter 323 as follows: 341A with 32A; 341B with VIH duty; 341C with 32C; 342A with 32B, 342B with VIL duty; and 342C with 32D. Those of skill in the art will readily recognize that certain other variations of these pairings are possible while being consistent with the teachings of the present subject matter. The outputs of duty-to-voltage low pass filters 341A, 341B, 341C are input to average comparator 361 while the outputs of duty-to-voltage low pass filters 342A, 342B, 342C are input to average comparator 362. Average comparators 361 and 362 output signals, similar to the VIH duty comparison signal and the VIL duty comparison signal, respectively, as described in FIG. 1 with reference to comparators 161 and 162, respectively. The details of the operation of the average comparators 361 and 362 will be discussed in further detail with respect to FIG. 5 below. The output of the average comparators 361 and 362 are sent to logic and driving code control 113 which operates as described above with respect to FIG. 1. Consequently the signal input to the circuit devices 31A, 31B, 31C, and 31D will be modified.

Also shown in FIG. 3 are loop 1, loop 2, loop 3, and loop 4. Loop 1, as shown, includes circuit device 31A and comparator 32A. Loop 2, as shown, includes circuit device 31B and comparator 32B. Loop 3, as shown, includes circuit device 31C, interposer/TSV 10E, load circuit 321, interposer/TSV 10E, and comparator 32C. Loop 4, as shown, includes circuit device 31D, interposer/TSV 10E, load circuit 321, interposer/TSV 10E, load circuit 322, and comparator 32D. It should be noted that a signal traversing either loop 1 or loop 2 does not have any output loading while a signal traversing either loop 3 or loop 4 will have a higher path load. These path loads will be described in more detail with respect to FIG. 5 below.

The above-described embodiment allows for on speed operation response of the chips to the then-current real load and transition times. Furthermore, the above-described system allows for adaptive adjustment of the driving strength between Chips A and B. Since the system includes an independent receiver comparator for VIH and VIL, there is no concern for propagation delay. Also, the transition times may be adjusted independently. The above-described embodiment allows for a single-chip solution to the calibration challenges of a 3D architecture since the transmission circuit, receiver circuit, calibration driver, and other mentioned devices all reside on Chip A. Additionally, in an embodiment where Chip A is at the "near end" of the 3D architecture and the only connection is to Chip B which is at the "far end" of the 3D architecture, no other chips need to be connected in the calibration circuit. This is shown below in FIG. 4.

Figure 4:
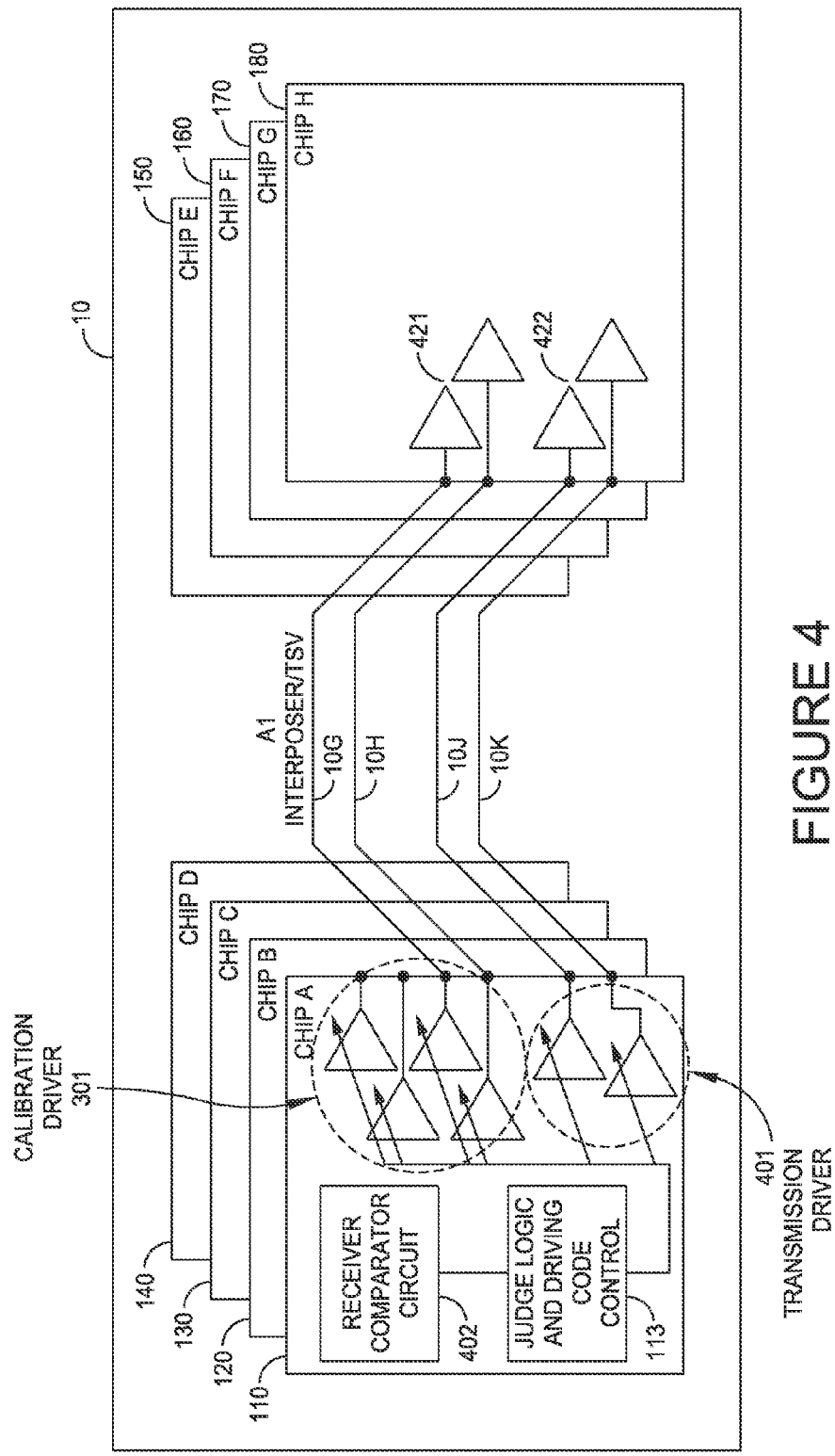
FIG. 4 is a pictorial view of a single chip calibration arrangement according to an embodiment of the present subject matter.

FIG. 4 is a pictorial view of a single chip calibration arrangement in a 3D architecture according to the above-described embodiment of the present subject matter. Shown in FIG. 4 are Chip A 110, Chip B 120, Chip C 130, Chip D 140, Chip E 150, Chip F 160, Chip G 170, and Chip H 180. Those of skill in the art will understand that this particular arrangement is for convenience of explanation only and in no way is the present subject matter intended to be restricted to this particular arrangement of chips. Chip A includes the operation and details of calibration driver 301, as discussed above with respect to FIG. 3, with the addition of adjustable drivers as shown (reference numbers omitted for clarity). Chip A also includes logic and driving code control 113 the output of which is used to modify the adjustable drivers as discussed above with respect to FIG. 1. Additionally, Chip A includes receiver circuit 402 which incorporates the operations and details of the duty generator counter, duty-to-voltage converter low pass filters, and average comparators discussed above with respect to FIG. 3.

Included in Chip A is transmission driver 401 which further include adjustable drivers as shown (reference numbers omitted for clarity). In this embodiment, calibration driver 301 is used only for calibration of the chips in the 3D architecture and is not used for information transfer between chips. Transmission driver 401 is used for information transfers between chips. It will be noted that the output of logic and driving code control 113 also modifies the adjustable drivers in the transmission driver so that they are modified the same way as the adjustable drivers in the calibration driver.

FIG. 4 also includes silicon interposer/TSV 10. Connections between Chip A, shown here to be at the "near end" of the 3D architecture, and Chip H, shown here to be at the "far end" of the 3D architecture, includes pathways 10G, 10H, 10J, and 10K through the silicon interposer/TSV. Chip H also includes circuit devices 421 and 422 which are representative of loads on their respective circuits/connections. Since Chips A and H are at opposite ends of the 3D architecture chip stack, calibration between these two devices is sufficient to calibrate the 3D architecture chip stack since the effects of all of the intervening chips will be necessarily taken into account.

Figure 5:
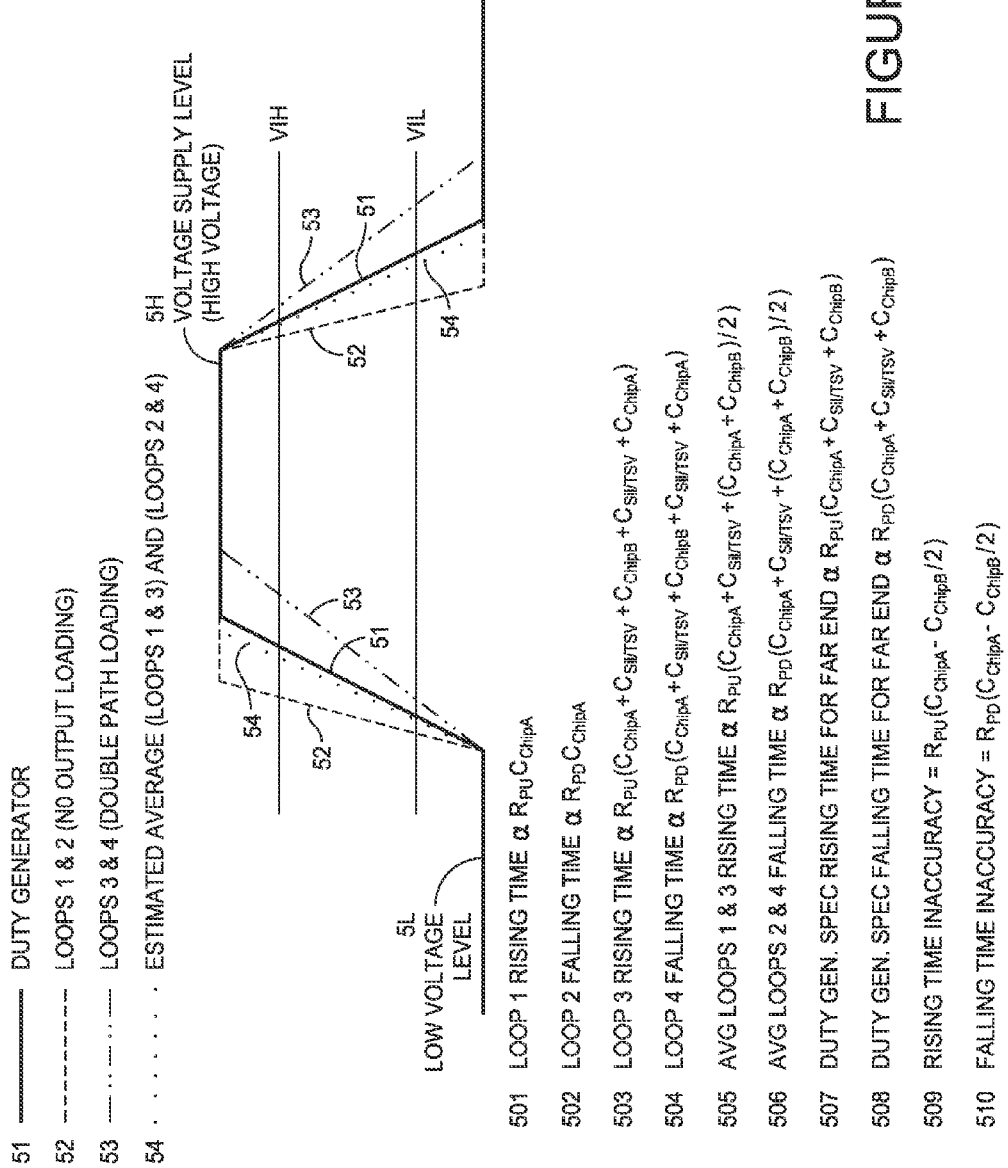
FIG. 5 is a representation of a voltage level profile according to an embodiment of the present subject matter.

With reference now to FIG. 5, a representation of a voltage level profile according to an embodiment of the present subject matter is presented. Line 51 represents a conventional profile of a duty cycle as may be produced by a duty generator such as the duty generator counter 123 in FIG. 1 or the duty generator counter 323 in FIG. 3. The profile 51 transitions between a low voltage value 5L, which may be electrical ground, and a high voltage value 5H, which may be a supply voltage level, as shown in FIG. 5. Additionally, the profile 51 is at or above a voltage input high ("VIH") signal, shown as VIH in FIG. 5, and a voltage input low ("VIL") signal, shown as VIL in FIG. 5, for a specific interval of time. The duty cycle for profile 51 may be changed by altering the transition times (rising time and falling time) between 5L and 5H thus changing the specific interval of time that the profile 51 is above VIH and VIL.

For the embodiment shown in FIG. 1, if the duty cycle for profile 51 is to be increased one way to accomplish this is to shorten the transition times between low voltage value 5L and high voltage value 5H. For example, if the transition time in FIG. 5 for the profile 51 is shortened, such as for the profile designated as 52, the time spent above VIH and VIL is increased thus increasing the duty cycle so that the duty cycle of profile 52 is greater than the duty cycle of profile 51. Similarly, if the transition time in FIG. 5 for the profile 51 is lengthened, such as for the profile designated as 53, the time spent above VIH and VIL is increased thus increasing the duty cycle so that the duty cycle of profile 53 is greater than the duty cycle of profile 51.

For the embodiment shown in FIG. 3, there are four loops as discussed above. Representative duty cycles for each of the loops are shown. For each of loop 1 and loop 2, the representative duty cycle is shown as profile 52. For each of loop 3 and loop 4, the representative duty cycle is show as profile 53. In this embodiment, a representative profile of an estimated average of loop 1 and loop 3 is shown as the profile 54. In an embodiment, profile 54 is also a representative profile of an estimated average of loop 2 and loop 4.

The rising time for each of loop 1, loop 2, loop 3, and loop 4 for the embodiment shown in FIG. 3 are proportional to the resistances and capacitances seen by the respective loop and can be calculated as follows:

LOOP 1 RISING TIME $\alpha\, R_{PD} C_{ChipA}$ where $R_{PD}$ is a pull-up resistance and $C_{ChipA}$ is a capacitance value for Chip A. As stated above, loop 1 has no output loading off of Chip A.

LOOP 2 FALLING TIME $\alpha\, R_{PD} C_{ChipA}$ where $R_{PD}$ is a pull-down resistance and $C_{ChipA}$ is a capacitance value for Chip A. As stated above, loop 2 has no output loading off of Chip A.

LOOP 3 RISING TIME $\alpha\, R_{PD}(C_{ChipA} + C_{Sil/TSV} + C_{ChipB} + C_{Sil/TSV} + C_{ChipA})$ where $R_{PD}$ is a pull-up resistance, $C_{ChipA}$ is a capacitance value for Chip A, $C_{Sil/TSV}$ is a capacitance value for the interposer/TSV, and $C_{ChipB}$ is a capacitance value for Chip B. As shown in FIG. 3 and stated above, loop 3 has off chip loading including traversing the silicon interposer/TSV path twice as well as a load with respect to Chip B. This may be seen as roughly a double path loading value.

LOOP 4 FALLING TIME $\alpha\, R_{PD}(C_{ChipA} + C_{Sil/TSV} + C_{ChipB} + C_{Sil/TSV} + C_{ChipA})$ where $R_{PD}$ is a pull-down resistance, $C_{ChipA}$ is a capacitance value for Chip A, $C_{Sil/TSV}$ is a capacitance value for the interposer/TSV, and $C_{ChipB}$ is a capacitance value for Chip B. As shown in FIG. 3 and stated above, loop 3 has off chip loading including traversing the silicon interposer/TSV path twice as well as a load with respect to Chip B. This may be seen as roughly a double path loading value.

Using the above equations, the average of loop 1 and loop 3 is:

AVG LOOPS 1 & 3 RISING TIME $\alpha\, R_{PU}(C_{ChipA} + C_{Sil/TSV} + (C_{ChipA} + C_{ChipB})/2)$ Likewise, the average of loop 2 and loop 4 is:

AVG LOOPS 2 & 4 FALLING TIME $\alpha\, R_{PD}(C_{ChipA} + C_{Sil/TSV} + (C_{ChipA} + C_{ChipB})/2)$ For the embodiment represented in FIG. 3, the specification for the duty generator counter rising time for Chip A and Chip B is:

DUTY GEN. SPEC RISING TIME FOR FAR END $\alpha$
$R_{PU}(C_{ChipA} + C_{Sil/TSV} + C_{ChipB})$ Likewise, for the embodiment represented in FIG. 3, the specification for the duty generator counter falling time for Chip A and Chip B is:

DUTY GEN. SPEC FALLING TIME FOR FAR END
$\alpha\, R_{PD}(C_{ChipA} + C_{Sil/TSV} + C_{ChipB})$ As can be seen from the equations above, there is only a minor difference between the average rising and falling times and the specification rising and falling times, respectively. The difference, or inaccuracy, between the two can be represented by the following equations:

RISING TIME INACCURACY = $R_{PU}(C_{ChipA} - C_{ChipB})/2)$

FALLING TIME INACCURACY = $R_{PD}(C_{ChipA} - C_{ChipB})/2)$

This inaccuracy is well within the capability of the single chip embodiment shown in FIG. 3 to maintain and/or alter the duty cycle of the 3D architecture/chip stack.

Figure 6:
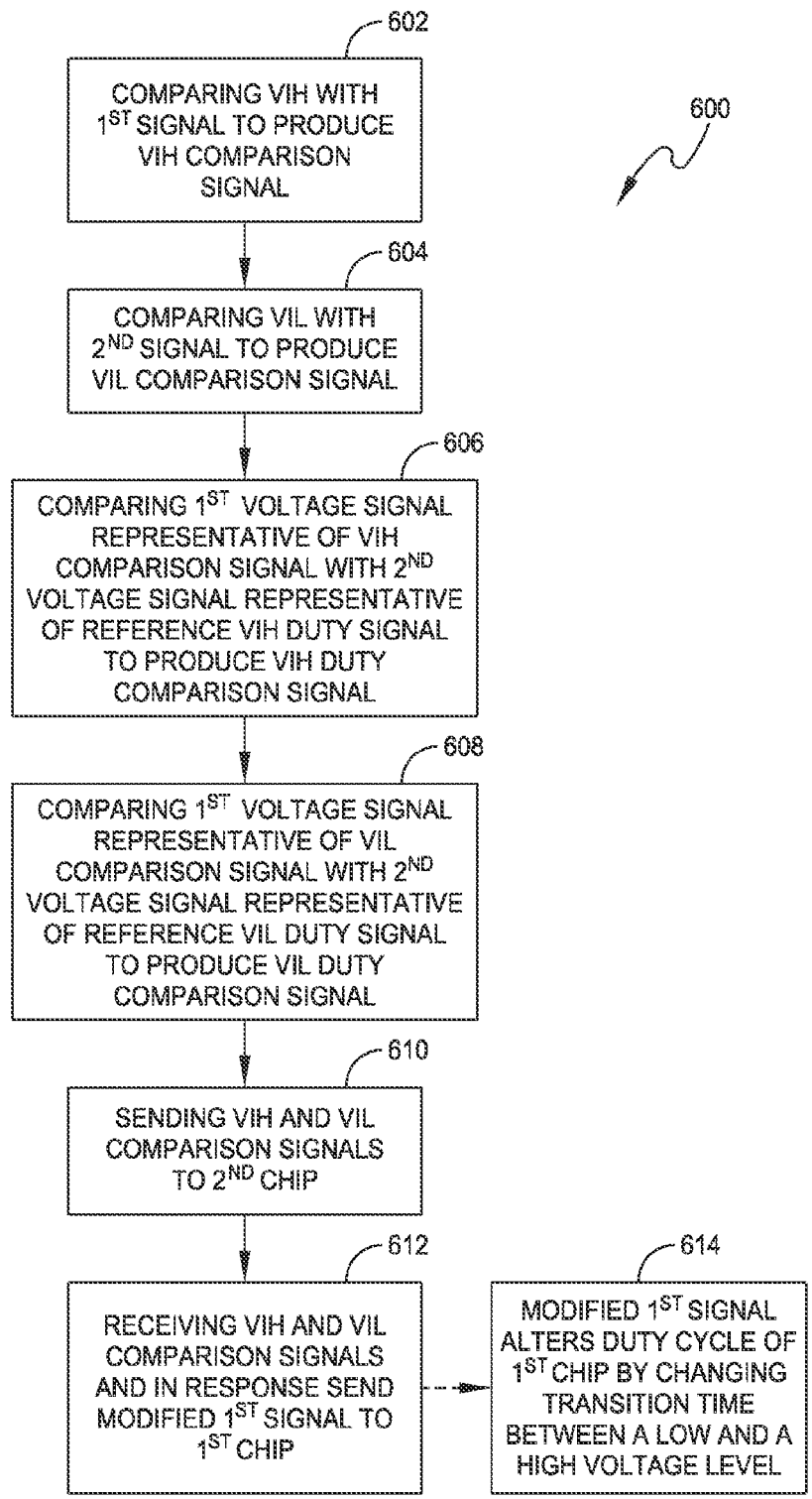
FIG. 6 is a flow diagram of methods for a chip-to-chip calibration arrangement according to an embodiment of the present subject matter.

With attention now drawn to FIG. 6, a flow diagram 600 of methods for a chip-to-chip calibration arrangement in a 3D chip stack/architecture according to an embodiment of the present subject matter is shown. At block 602, on a first chip, a VIH signal is compared with a first signal to produce a VIH comparison signal. The first signal typically is a VIH calibration signal from a second chip, as discussed above with reference to FIG. 1. At block 604, a VIL signal is compared with a second signal to produce a VIL comparison signal. The second signal typically is a VIL calibration signal from the second chip, as discussed above with reference to FIG. 1. At block 606, a first voltage signal representative of the VIH comparison signal is compared with a second voltage signal representative of a reference VIH duty signal to thereby produce a VIH duty comparison signal. At block 608, a first voltage signal representative of the VIL comparison signal is compared with a second voltage signal representative of a reference VIL duty signal to thereby produce a VIL duty comparison signal. At block 610, the VIH and VIL duty comparison signals are sent to the second chip. At block 612, the VIH and VIL duty comparison signals are received at the second chip and in response to the VIH and VIL duty comparison signals, the second chip sends a modified first signal to the first chip.

In a further embodiment, at block 614, the modified first signal alters a duty cycle of the first chip by changing a transition time between a low level and a high voltage level.

Figure 7:
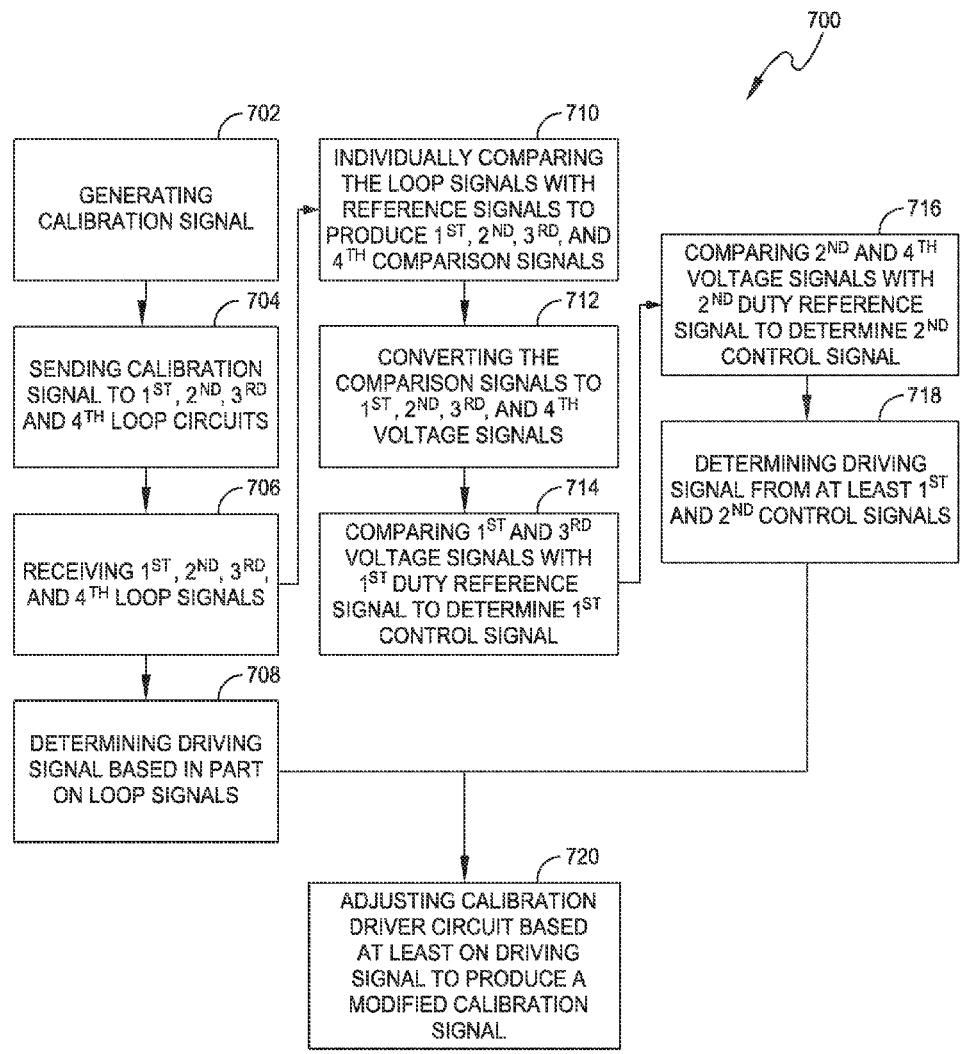
FIG. 7 is a flow diagram of methods for a single chip calibration arrangement according to embodiments of the present subject matter.

Now considering FIG. 7, a flow diagram 700 of methods for a single chip calibration arrangement in a 3D chip stack/architecture according to embodiments of the present subject matter is presented. In one embodiment at block 702, on a first chip in a 3D architecture/chip stack, a calibration signal is generated using a calibration driver circuit. At block 704, the calibration signal is sent to a first, a second, a third, and a fourth loop circuit. At block 706 the calibration signal sent to the first, second, third, and fourth loop circuits returns as a first, a second, a third, and a fourth loop signal, respectively. At block 708, a driving signal is determined based at least on the first, second, third, and fourth loop signals. At block 720, the calibration driver circuit is adjusted based on at least the driving signal to thereby produce a modified calibration signal.

In another embodiment, blocks 702, 704, and 706 are as described above. At block 710, the first, second, third, and fourth loop signals are each individually compared with a predetermined one of two reference signals to thereby determine a respective first, second, third, and fourth comparison signal. As a non-limiting example, the first loop signal is compared with a VIH signal to produce the first comparison signal; the second loop signal is compared with a VIL signal to produce the second comparison signal, the third loop signal is compared with a VIH signal to produce the third comparison signal, and the fourth loop signal is compared with a VIL signal to produce the fourth loop signal. At block 712, the first, second, third, and fourth comparison signals are converted into a first, a second, a third, and a fourth voltage signal, respectively. At block 714, in one embodiment, the first and third voltage signals are compared with a first duty reference signal to thereby determine a first control signal. The first duty reference signal may be a voltage signal representative of a VIH duty signal generated by a duty generator counter such as is shown in FIG. 3. In an embodiment, the first and third voltage signals are averaged and the average is compared with the first duty reference signal. At block 716, in one embodiment, the second and fourth voltage signals are compared with a second duty reference signal to thereby determine a second control signal. The second duty reference signal may be a voltage signal representative of a VIL duty signal generated by a duty generator counter such as is shown in FIG. 3. In an embodiment, the second and fourth voltage signals are averaged and the average is compared with the second duty reference signal. At block 718, a driving signal is determined from at least the first and second control signals. At block 720, as described above, the calibration driver circuit is adjusted based on at least the driving signal to thereby produce a modified calibration signal.

As shown by the various configurations and embodiments illustrated in FIGS. 1-7, a system and method for location and network timing recovery in communications networks have been described.

While preferred embodiments of the present subject matter have been described, it is to be understood that the embodiments described are illustrative only and that the scope of the invention is to be defined solely by the appended claims when accorded a full range of equivalence, many variations and modifications naturally occurring to those of skill in the art from a perusal hereof.

We claim:

1. A system for calibrating a chip in a 3D chip stack, the system comprising:
   a first and a second chip, each in said chip stack;
   said first chip comprising a receiver circuit, wherein said receiver circuit comprises:
   a first comparator circuit having a first input for receiving a VIH signal, a second input for receiving said VIH calibration signal, and an output for sending a VIH comparison signal;
   a second comparator circuit having a first input for receiving a VIL signal, a second input for receiving said VIL calibration signal, and an output for sending a VIL comparison signal;
   a duty generator counter having a first output for sending a VIH duty signal and a second output for sending a VIL duty signal;
   a third comparator circuit having a first input for receiving a first voltage signal representative of said VIH comparison signal, a second input for receiving a second voltage signal representative of said VIH duty signal, and an output for sending a VIH duty comparison signal; and
   a fourth comparator circuit having a first input for receiving a first voltage signal representative of said VIL comparison signal, a second input for receiving a second voltage signal representative of said VIL duty signal, and an output for sending a VIL duty comparison signal,
   wherein said second signal comprises said VIH and VIL duty comparison signals, and
   wherein said VIH and VIL duty comparison signals are input to said logic and driving control circuit; and
   said second chip comprising a transmission circuit having a first output operatively connected to a first input of said receiver circuit, and a second output operatively connected to a second input of said receiver circuit, and the inputs of said transmission circuit operatively connected to each of a first and a second output of said receiver circuit.

2. The system of claim 1 wherein said first signal alters a duty cycle of said first chip by changing a transition time between a high voltage and a low voltage.

3. The system of claim 1 wherein said first chip further includes a transmission circuit and said second chips further includes a receiver circuit.

4. The system of claim 3 wherein the outputs of each of said receiver circuits and the inputs of each of said transmission circuits are commonly connected.

5. The system of claim 4 wherein said common connection is through a silicon interposer or through a through silicon via.

6. The system of claim 1 wherein said transmission circuit comprises:
   a logic and driving control circuit having an output for sending a driving signal;
   a first driver circuit for sending a voltage input high ("VIH") calibration signal in response to said driving signal; and
   a second driver circuit for sending a voltage input low ("VIL") calibration signal in response to said driving signal,
   wherein said first signal comprises said VIH and VIL calibration signals.

7. The system of claim 1 wherein said VIH and VIL calibration signals are transmitted between said first and second chips through separate signal paths, and
   wherein said VIH and VIL duty comparison signals are transmitted between said first and second chips through the same signal path.

8. A method for calibrating a chip in a 3D chip stack, the method comprising the steps of:
   on a first chip in said chip stack:
   (a) comparing a voltage input high ("VIH") signal with a first signal to thereby produce a VIH comparison signal;
   (b) comparing a voltage input low ("VIL") signal with said first signal to thereby produce a VIL comparison signal;
   (c) comparing a first voltage signal representative of said VIH comparison signal with a second voltage signal representative of a reference VIH duty signal to thereby produce a VIH duty comparison signal;
   (d) comparing a first voltage signal representative of said VIL comparison signal with a second voltage signal representative of a reference VIL duty signal to thereby produce a VIL duty comparison signal; and
   (e) sending said VIH duty comparison signal and said VIL duty comparison signal to a second chip in said chip stack;
   and on said second chip:
   (f) receiving said VIH duty comparison signal and said VIL duty comparison signal and in response thereto sending a modified first signal to said first chip.

9. The method of claim 8 wherein said modified first signal alters a duty cycle of said first chip by changing a transition time between VIH and VIL.

* * * * *